US006961132B2

(12) United States Patent
Ouchi

(10) Patent No.: US 6,961,132 B2

(45) Date of Patent: Nov. 1, 2005

(54) INTERFERENCE SYSTEM AND SEMICONDUCTOR EXPOSURE APPARATUS HAVING THE SAME

(75) Inventor: Chidane Ouchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/693,880

(22) Filed: Oct. 28, 2003

(65) Prior Publication Data

US 2004/0085548 A1 May 6, 2004

Related U.S. Application Data

(62) Division of application No. 09/893,636, filed on Jun. 29, 2001, now Pat. No. 6,661,522.

(30) Foreign Application Priority Data

Jun. 30, 2000 (JP) .................................... 2000/199435

(51) Int. Cl.$^7$ .................................... G01B 9/02

(52) U.S. Cl. .................................... 356/515

(58) Field of Search .................................... 356/479, 497, 356/511, 512, 515

(56) References Cited

U.S. PATENT DOCUMENTS

| | | | | | |
|---|---|---|---|---|---|
| 4,627,731 | A | | 12/1986 | Waters et al. | 356/349 |
| 4,938,596 | A | | 7/1990 | Gauthier et al. | 356/360 |
| 5,815,268 | A | | 9/1998 | LaFleur | 356/359 |
| 5,898,501 | A | | 4/1999 | Suzuki et al. | 356/359 |
| 6,037,579 | A | | 3/2000 | Chan et al. | 250/216 |
| 6,266,147 | B1 | | 7/2001 | Naulleau | 356/515 |
| 6,456,382 | B2 | * | 9/2002 | Ichihara et al. | 356/513 |
| 6,614,535 | B1 | * | 9/2003 | Kakuchi et al. | 356/515 |
| 6,633,362 | B2 | * | 10/2003 | Murakami et al. | 355/53 |
| 6,661,522 | B2 | * | 12/2003 | Ouchi | 356/515 |
| 2001/0026367 | A1 | | 10/2001 | Magome | 356/521 |

* cited by examiner

*Primary Examiner*—Gregory J. Toatley, Jr.
*Assistant Examiner*—Michael A. Lyons
(74) *Attorney, Agent, or Firm*—Fitzpatrick, Cella, Harper & Scinto

(57) ABSTRACT

An exposure apparatus for exposing a substrate with a pattern of an original includes a projection optical system for projecting the pattern of the original onto the substrate with light from a light source, and an interferometer for measuring an optical characteristic of the projection optical system by use of the light from the light source, which passes a pinhole and the projection optical system. The pinhole has a diameter which is smaller than a diameter of an Airy disc.

6 Claims, 2 Drawing Sheets

INTERFERENCE SYSTEM AND SEMICONDUCTOR EXPOSURE APPARATUS HAVING THE SAME

This application is a divisional application of U.S. patent application Ser. No. 09/893,636, filed on Jun. 29, 2001 now U.S. Pat. No. 6,661,522.

FIELD OF THE INVENTION AND RELATED ART

This invention relates to an interference system and a semiconductor exposure apparatus having the same. Particularly, the present invention is suitably applicable to a system, such as a wavefront aberration measuring machine for a projection lens used in a semiconductor device manufacturing exposure apparatus, for example, in which the length of the optical path is large and, additionally, high precision wavefront measurement is required through the wavelength of light rays usable for the measurement is restricted, and also in which the wavefront aberration of the projection lens should be measured while the lens is kept mounted on the apparatus.

Conventionally, a transmission wavefront of a projection lens is a semiconductor device manufacturing exposure apparatus is measured, in many cases, by using a Fizeau type interferometer in which most of the light path for reference light and detection light is consistent, for attaining high precision measurement. In the wavefront measurement by using such a Fizeau type interferometer, a lens (projection lens), which is the subject to be measured, is placed between a Fizeau plane (or surface) and a reflection reference mirror surface. The transmission wavefront of the subject to be measured is measured on the basis of interference of the two lights reflected by these two surfaces. For this reason, the light source to be used in a Fizeau type interferometer must be one which can emit light having a coherency more than twice that of the optical path length between the Fizeau plane and the reflection reference mirror surface. In addition to this, the wavelength of light used for the wavefront measurement must be the same as or very close to the wavelength of exposure light to be used in the semiconductor exposure apparatus. For example, for measurement of the wavefront aberration of a projection lens where g-line light (435 nm) is used as exposure light, a HeCd laser which emits light having a wavelength of 442 nm may be used. For measurement of the wavefront aberration of a projection lens where i-line light (365 nm) is used as exposure light, an Ar ion laser which emits light having a wavelength of (365 nm) may be used. For measurement of the wavefront aberration of a projection lens when a KrF excimer laser (248 nm) is used as exposure light, a second harmonic of an Ar ion laser which emits light having a wavelength of 248 nm may be used. However, for measurement of the wavefront aberration of a projection lens when an ArF excimer laser (193 nm) is used as exposure light, a light source having a similar wavelength and a large coherence length is not currently available. Therefore, it is not possible to make a Fizeau type interferometer and, as a consequence, a Twyman-Green type interferometer is used. The latter is arranged so that, for the measurement of wavefront aberration, the optical path lengths for the reference light and the detection light are made equal to each other, such that the measurement is attainable even with the use of a light source having a short coherence length.

SUMMARY OF THE INVENTION

A reduction in size of a semiconductor device pattern requires a higher optical performance of a projection lens.

Also, it needs high precision measurement for an interferometer for the lens measurement, and the projection lens itself should keep a very accurate optical performance. This means that the transmission wavefront of a projection lens should desirably be measured while the lens is kept mounted on a semiconductor exposure apparatus. However, since in a Twyman-Green type interferometer the reference light and the detection light pass along different optical paths, there is a disadvantage that it is easily influenced by an external disturbance. Additionally, because of the necessity of the reference light, the size of the interferometer becomes large, which is very inconvenient when the interferometer is mounted on the semiconductor exposure apparatus.

It is accordingly an object of the present invention to provide a Fizeau type interferometer system capable of measuring wavefront aberration of a projection lens very accurately even when a light source which emits light of a short coherence length is used, and also to provide an exposure apparatus having the same.

It is another object of the present invention to provide an exposure apparatus with a Fizeau type interferometer, by which the transmission wavefront of a projection lens can be measured in a state that the projection lens is kept mounted.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
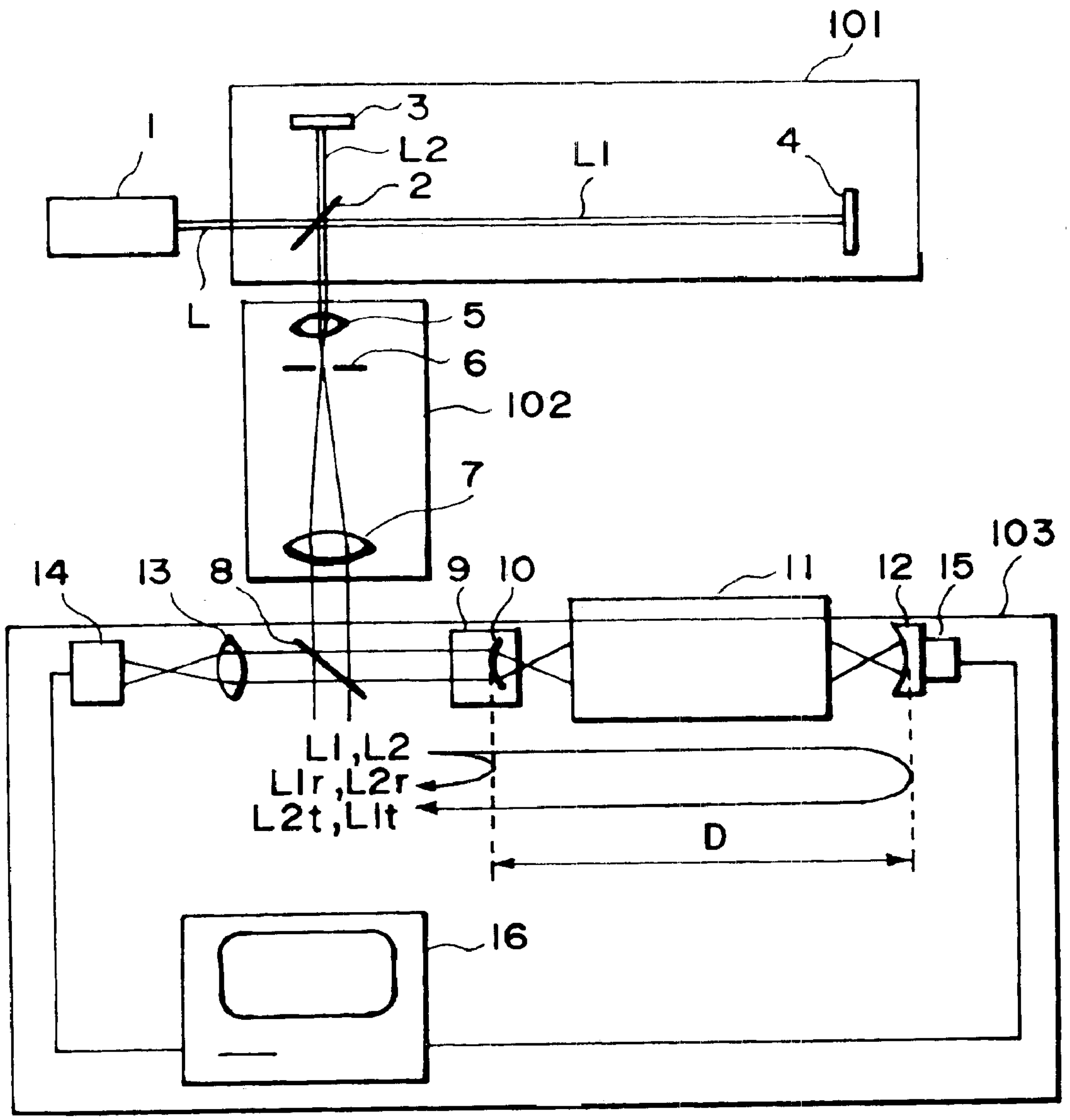
FIG. 1 is a schematic view of a main portion of an interference system according to an embodiment of the present invention.

FIG. 1 is a schematic view of a main portion of an interference system according to an embodiment of the present invention. In FIG. 1, light L emitted from a laser (light source) 1 enters an optical path length difference applying unit 101. With this unit 101 and by means of a beam splitter 2, the light L is divided into light L1 directed to a mirror 3 and light L2 directed to a mirror 4. The light L1 (L2) is reflected by the mirror 3 (4) and, after this, it returns to the beam splitter 2. The distance between the beam splitter 2 and the mirror 3 is set to be longer than the distance between the beam splitter 2 and the mirror 4, by an amount corresponding to the optical path length D between a Fizeau plane 10 and a reflection reference mirror 12 (both to be described later). As a result of this, while both of the light L1 passing through the beam splitter 2 and the light L2 reflected thereby are directed to a convex lens 5, and light L2 goes ahead of the light L1 by an amount equal to the optical path length 2D. The convex lens 5 and a pinhole 6 as well as a convex lens 7 are components which constitute a spatial filter 102 for producing a single spherical wave, and the pinhole 6 is disposed at the focal point position of the convex lens 5. When the diameter of the pinhole 6 is set to be about a half of an Airy disc's diameter, the light emitted from the pinhole 6 can be regarded as being an approximately spherical wave, such that the difference in wavefront of the lights L1 and L2 produced by the optical path length difference applying unit 101 can be removed. Here, the pinhole 6 may be replaced by a single-mode optical fiber, and similar advantageous results are attainable. The lights L1 and L2 emitted from the pinhole 6 are transformed by the convex lens 7 into parallel light, and then they are incident on a beam splitter 8. The light reflected by the beam splitter 8 enters a Fizeau lens 9 whose final surface is a Fizeau plane (surface) 10. In both of the lights L1 and L2, a portion of the light is reflected by the Fizeau plane 10, whereby lights L1*r* and L2*r* are directed to the beam splitter 8. On the other hand, the remaining portion of the light passes through the Fizeau plane 10 as lights L1*t* and L2*t*, and they pass through a lens 11 which is the subject to be measured. Then, the light is reflected by a reflection reference mirror 12 and, again, passes through the lens 11 and the Fizeau lens 9 toward the beam splitter 8. These lights L1*r*, L2*r*, L1*t* and L2*t* as they pass through the beam splitter 8 go through an imaging lens 13, and they are incident on a camera 14. The imaging lens 13 is so designed and disposed that an entrance pupil of the lens 11 and the camera 14 are brought into an optically conjugate relation with each other. Therefore, the pupil of the lens 11 is imaged on the camera 14.

The elements denoted at 8–16 are components of a Fizeau interferometer 103.

In this embodiment, light L1*r* of the two lights L1*r* and L2*r* as reflected by the Fizeau plane 10 is propagated through a long optical path by the optical path difference applying unit 101, and light L2*t* of the two lights L1*t* and L2*t* as reflected by the reflection reference mirror 12 is propagated through a short optical path by the unit 101. The optical path difference (=L1*r*–L2*t*) between the lights L1*r* and L2*t* is set to be not greater than the coherence length ΔL of the light source 1. As a result, these two lights L1*r* and L2*t* can interfere with each other, such that the wavefront of the lens 11 disposed between the Fizeau plane 10 and the reflection reference mirror 12 can be measured. Also, since the optical path difference ΔD=2(L1–L2) at the optical path difference applying unit 101 is kept not less than the coherence length ΔL of the light source, that is, ΔL<ΔD, there occurs no interference of any light other than those aforementioned, being adversely influential to the wavefront measurement. Further, even if the two lights have different wavefronts as they are separated by the optical path difference applying unit, since both of them pass through a spatial filter before impinging on the Fizeau plane, it is assured that they have the same wavefront. Therefore, degradation of precision of the interference measurement can be avoided.

As regards the optical disposition of the optical components described above, it is determined to satisfy the following relations, when the optical path difference between two lights L1 and L2 applied by the optical path difference applying unit 101 is ΔD(2D), the coherence length of the light source 1 is ΔL, and the optical path difference of the Fizeau interferometer (twice the optical path length between the Fizeau plane 10 and the reference surface 12) is ΔF:

$$\Delta L < \Delta D$$

$$|\Delta D - \Delta F| < \Delta L.$$

In this embodiment, among the lights L1*r*, L2*r*, L1*t* and L2*t* impinging on the camera 14, the lights L2*t* and L1*r* interfere with each other upon the camera 14 since the optical path difference from the laser 1 to the camera 14 is not greater than the coherence length. Additionally, since the light L2*t* has passed the lens 11, whereas the light L1*r* has not passed it, an interference pattern produced thereby represents the shape of the wavefront upon the exit pupil of the lens 11.

On the other hand, since the lights L1*r* and L2*t* have an optical path difference with the other lights L2*r* and L1*t*, of an amount greater than the coherence length, none of them interferes with the other. Therefore, these lights do not disturb the interference pattern produced by the lights L2*t* and L1*r*. The reflection reference mirror 12 can be shifted in the optical axis direction, by means of a piezoelectric driving unit 15 being controlled by a computer 16. The computer 16 processes an imagewise output of the camera 14 while shifting the reflection reference mirror 12, in accordance with a method which is well known in the art as a phase scan method, and the transmission wavefront of the lens 11 is calculated. As a matter of course, the element to be shifted by the piezoelectric driving unit 15 may be the Fizeau lens 9, the mirror 3 or the mirror 4.

As described above, the interference system of this embodiment comprises an optical path difference applying unit which includes a beam splitter for dividing light emitted from a laser (light source 1) and re-combining the divided lights, and a mirror disposed so that the optical path difference in a portion where the two lights are kept separated from each other is not less than the coherence length of the light source and also that the difference with respect to the optical path length of a Fizeau interferometer (twice the optical path length between the reflection reference mirror and the Fizeau plane, constituting an interferometer) is not greater than the coherence length of the light source. Also, it further comprises a spatial filter disposed to assure that the two lights passed through the optical path difference applying unit have the same wavefront, before they are incident on the Fizeau plane, and additionally, a Fizeau interferometer.

Figure 2:
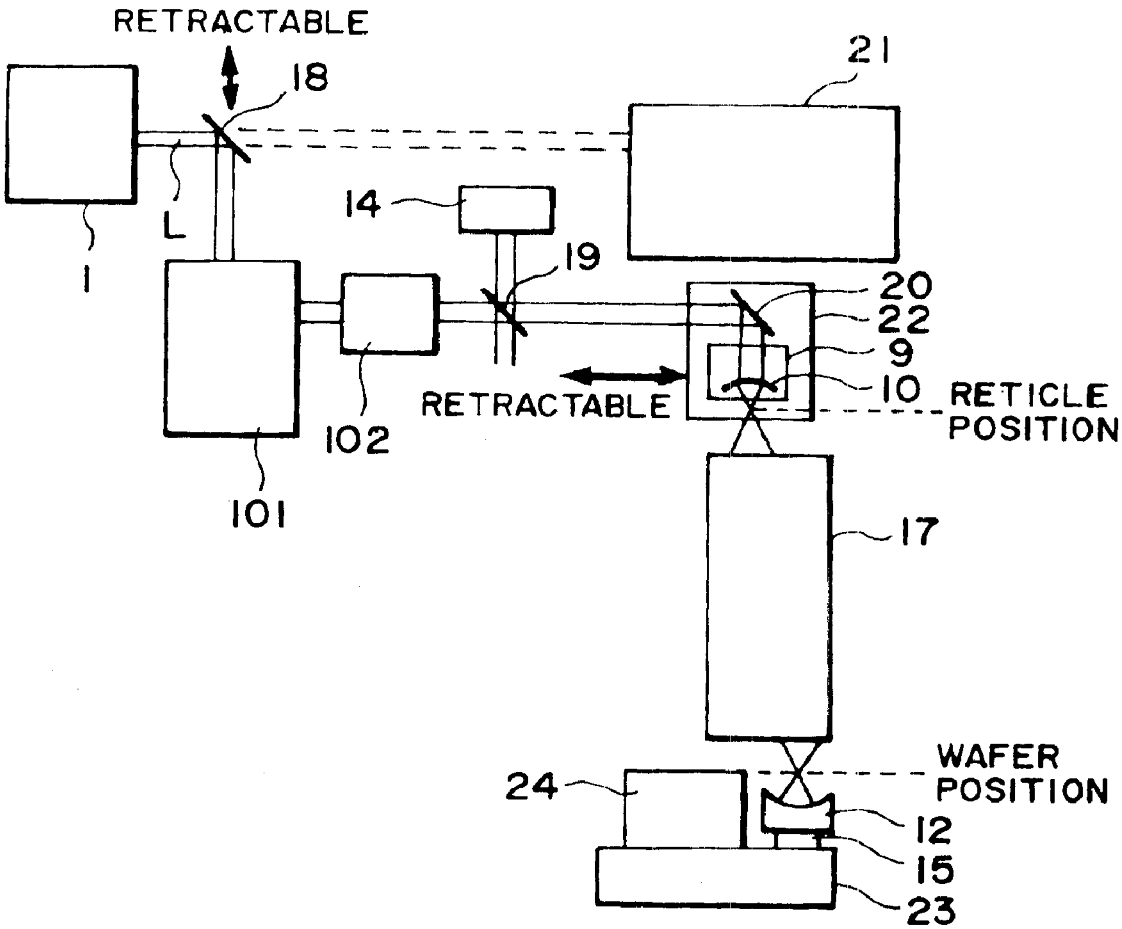
FIG. 2 is a schematic view of a main portion of a semiconductor exposure apparatus having an interference system according to an embodiment of the present invention.

FIG. 2 is a schematic view of a main portion of a semiconductor exposure apparatus in which an interference system according to the present invention is incorporated. Laser 1 is used as a light source both for exposure of a wafer to print a reticle pattern thereof, and for the measurement.

In FIG. 2, a projection lens 17 corresponds to the lens 11 of FIG. 1 to be measured. Here, the projection lens 17 functions to project a pattern formed on the surface of a reticle (not shown) onto a wafer (not shown). Then, a known development process is performed to the wafer to which the pattern is printed by exposure, and semiconductor devices are produced.

In FIG. 2, light L emitted from the laser 1 is reflected by a switching mirror 18, and it passes through an optical path difference applying unit 101, a spatial filter 102, and a beam splitter 19, sequentially. After this, the light is reflected by a mirror 20 and it enters a Fizeau lens 9 whose final surface is a Fizeau plane (surface) 10. After this, as in the first embodiment of FIG. 1, the transmission wavefront of the projection lens 17 (as the lens 11 in FIG. 1) can be calculated in the same manner. The curvature centers of the Fizeau plane 10 and the reflection reference mirror 12 are disposed to be coincident with the reticle position and the wafer position with respect to the projection lens 17, respectively. The reference mirror 12 is disposed adjacent to a wafer chuck 24 on the wafer stage 23, for carrying a wafer thereon. Through the motion of the wafer stage 23, the curvature center of the reference mirror 23 can be brought into registration with a desired image height in the range of the maximum image heigh of the projection lens 17. On the other hand, both of the mirror 20 and the Fizeau lens 9 are mounted on a movable stage 22, such that, with the motion of hte stage 22, the curvature center of the Fizeau plane 10 can be moved to a position which is optically conjugate with the curvature center of the reference mirror 12 with respect to the projection lens 17. In this manner, at an arbitrary image height of the projection lens, the transmission wavefront can be measured. Here, the switching mirror 20 is made movable. For wafer exposure, the mirror is retracted out of the laser light path to allow that light enters an illumination optical system 21 for illuminating a reticle. Similarly, for the wafer exposure, through the motion of stage 22, the mirror 20 and the Fizeau lens 10 are retracted so as not to block the illumination light from the illumination optical system 21. It is to be noted that, in FIG. 2, the imaging lens 13 and the computer 16 of FIG. 1 are not illustrated. Further, while in this embodiment the interferometer light source functions also as a semiconductor exposure light source, a separate light source may be provided for the interferometer.

In accordance with the embodiments of the present invention as described hereinbefore, there is provided a Fizeau type interference system and an exposure apparatus having the same by which, even if a light source which emits light of a short coherence length is used, the wavefront aberration of a projection lens can be measured very precisely.

Further, even when a long coherence length light source is not available for the transmission wavefront measurement so that a Fizeau interferometer being advantageous to the high precision measurement cannot be constructed, with the present invention it becomes possible to perform measurement by means of a Fizeau interferometer, by the provision of an optical path difference applying unit and a spatial filter. When such an interference system is incorporated into an exposure apparatus, the transmission wavefront of a projection optical system can be measured while the projection optical system is kept mounted.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate with a pattern of an original, said apparatus comprising:

a projection optical system for projecting the pattern of the original onto the substrate with light from a light source;

an optical path difference applying optical system for dividing light from the light source into two light beams and for re-combining the two light beams;

an optical unit for directing light from said optical path difference applying optical system to a pinhole; and an interferometer for measuring an optical characteristic of said projection optical system by use of the light from said optical path difference applying optical system which passes the pinhole and said projection optical system, wherein the pinhole is disposed at a focal point position of said optical unit, and wherein the pinhole has a diameter which is smaller than a diameter of an Airy disc.

2. An apparatus according to claim 1, wherein the diameter of the pinhole is about a half of the diameter of the Airy disc of the light from said light source.

3. An apparatus according to claim 1, wherein the optical characteristic is wavefront aberration.

4. An apparatus according to claim 1, wherein said interferometer is a Fizeau interferometer.

5. An exposure apparatus for exposing a substrate with a pattern of an original, said apparatus comprising:

a projection optical system for projecting the pattern of the original onto the substrate with light from a light source;

an optical path difference applying optical system for dividing light from the light source into two light beams and for re-combining the two light beams;

an optical unit for directing light from said optical path difference applying optical system to a pinhole; and a photosensitive element for detecting light from said optical path difference applying optical system which passes the pinhole and said projection optical system as an interference signal, wherein the pinhole is disposed at a focal point position of said optical unit, and wherein the pinhole has a diameter which is smaller than a diameter of an Airy disc.

6. A device manufacturing method, comprising the steps of:

exposing a substrate with a pattern of an original by use of an exposure apparatus; and developing the exposed substrate, wherein the exposure apparatus includes (i) a projection optical system for projecting the pattern of the original onto the substrate with light from a light source, (ii) an optical path difference applying optical system for dividing light from the light source into two light beams and for re-combining the two light beams, and (iii) an optical unit for directing light from the optical path difference applying optical system to a pinhole, and (iv) an interferometer for measuring an optical characteristic of the projection optical system by use of light from the optical path difference applying optical system which passes the pinhole and the projection optical system, wherein the pinhole is disposed at a focal point position of the optical unit, and wherein the pinhole has a diameter which is smaller than a diameter of an Airy disc.

* * * * *